United States Patent [19]

Griswold et al.

[11] 3,998,638

[45] Dec. 21, 1976

[54] METHOD OF DEVELOPING OPAQUELY COATED SENSITIZED MATRIX WITH A SOLUTION CONTAINING SODIUM META-SILICATE

[75] Inventors: Douglas A. Griswold, Blossburg, Pa.; Harry L. Ormsby, Horseheads; Harold D. Wilcox, Elmira, both of N.Y.

[73] Assignee: Westinghouse Electric Corporation, Pittsburgh, Pa.

[22] Filed: May 22, 1975

[21] Appl. No.: 579,755

[52] U.S. Cl. ............................... 96/36.1; 96/48 R; 427/68
[51] Int. Cl.² ........................................ G03C 5/00
[58] Field of Search ............... 96/36.1, 48 R, 35.1; 427/68

[56] References Cited

UNITED STATES PATENTS

| | | | |
|---|---|---|---|
| 3,558,310 | 1/1971 | Mayaud | 96/36.1 |
| 3,615,460 | 10/1971 | Lange | 96/36.1 |
| 3,623,867 | 11/1971 | Saulnier | 96/36.1 |
| 3,632,339 | 1/1972 | Khan | 96/36.1 |
| 3,658,530 | 4/1972 | Hedler et al. | 96/36.1 |
| 3,677,758 | 7/1972 | Kaplan | 96/36.1 |
| 3,712,815 | 1/1973 | Rohrer | 96/36.1 |
| 3,788,846 | 1/1974 | Mayaud et al. | 96/36.1 |
| 3,793,035 | 2/1974 | Patel et al. | 96/36.1 |
| 3,837,885 | 9/1974 | Angelucci | 96/36.1 |

*Primary Examiner*—Edward C. Kimlin
*Attorney, Agent, or Firm*—W. G. Sutcliff

[57] ABSTRACT

In the method of fabricating color television picture tubes, it is desirable to photo-expose and develop the exposed portions to define a phosphor matrix pattern. In such techniques an opaque coating may be deposited over the sensitized matrix coating which is to be developed. A periodate containing solution, to which is added a predetermined amount of sodium meta-silicate, is used as the developing solution to remove the sensitized matrix portions, while leaving behind the opaque light absorbing pattern on the screen substrate.

3 Claims, No Drawings

METHOD OF DEVELOPING OPAQUELY COATED SENSITIZED MATRIX WITH A SOLUTION CONTAINING SODIUM META-SILICATE

BACKGROUND OF THE INVENTION

This invention is related to the manufacture of color television display screens. The prior art manufacturing techniques are described in greater detail in U.S. Pat. No. 3,712,815 issued Jan. 23, 1973, entitled "Method of Manufacturing a Display Screen", and in U.S. Pat. No. 3,793,035, issued Feb. 19, 1974, entitled "Method of Developing Opaquely Coated Sensitized Matrix with Periodate Containing Solution", which patents are owned by the assignee of the present invention.

The aforementioned patents disclose a manufacturing technique in which a photosensitive layer is deposited upon a screen substrate and exposed to light through a conventional shadow mask to sensitize the photosensitive material in a selected pattern. An opaque coating is then applied over the entire screen, and the screen treated with a developing solution which includes a periodate containing compound which is readily soluble, and wherein the pH is adjusted to a predetermined range using selected reagents such as ammonium hydroxide and/or sulfuric acid.

While the aforementioned developing solution with the reagents mentioned has been found useful, the reagents are relatively harsh and require careful handling as well as being corrosive reagents with respect to the manufacturing equipment with which they come in contact. The use of relatively harsh reagents, such as ammonium hydroxide and sulfuric acid, can also degrade the opaque layer in the process of developing the photosensitized layer beneath the opaque layer. This opaque layer is intended to remain in the final color television picture tube in a relatively uniform thickness over selected areas of the screen. It is important in the developing process that the photosensitive material be removing as well as the opaque material atop the photosensitized portions, and that the remaining portions of the opaque layer upon the substrate be uniform and not be adversely affected by the developing solution.

SUMMARY OF THE INVENTION

An improved method for establishing a light-absorbing pattern on a screen substrate of an image display device. A photosensitizable layer of polyvinyl alcohol is deposited upon the screen substrate, which is exposed to photo-radiation to render selected portions less soluble. The unexposed polyvinyl alcohol portions are washed away from the substrate, and an opaque coating is applied to the substrate, as well as atop the exposed insoluble polyvinyl alcohol portions which remain on the substrate. The opaquely coated insoluble polyvinyl alcohol portions are then developed with a periodate containing solution to remove the coated exposed portions. The opaque coating remains on the screen substrate. A predetermined amount of sodium meta-silicate is included in the developing solution, and preferably in an amount of about 0.004 weight percent of the periodate containing solution.

DESCRIPTION OF THE PREFERRED EMBODIMENTS

The invention will now be described by way of a specific example embodiment. The glass face plate for a display screen which is to be incorporated into the color television picture tube is first cleaned and rinsed, and a coating of photo-sensitizable polyvinyl alcohol is applied thereto. Polyvinyl alcohol is typically sensitized with ammonium dichromate. A colloidal silicate containing precoat layer may be applied to the glass face plate to facilitate retention of the polyvinyl alcohol layer upon the glass face plate. The details of such coating processes are more fully described in the aforementioned U.S. Pat. No. 3,712,815, which are incorporated here in my reference.

A conventional aperture shadow mask and light source are thereafter used to expose the sensitized coatings through the individual apertures in the mask in a lighthouse, as is well known in the art. The shadow mask is removed and the polyvinyl alcohol coating, which has been selectively rendered insoluble is subjected to a spray of deionized water developer, to rinse away the soluble unexposed polyvinyl alcohol areas on the face plate. This leaves polyvinyl alcohol areas corresponding to the positions of the eventually deposited phosphor areas on color television display screens. An opaque material containing colloidal suspension, such as graphite in water available under the trade name "Aquadag" which may be purchased from Achison Colloid Company of Port Huron, Michigan, is then applied to the face plate over the remaining polyvinyl alcohol areas. After the graphite coating, the dried face plate panel is now treated with a chemical developing solution to remove the polyvinyl alcohol areas and the opaque coating on top of these areas, while leaving the remaining opaque coating on the glass face plate about the areas from which the polyvinyl alcohol areas have been removed. The chemical dissolving solution according to the present invention is prepared by adding to about 1 gallon of distilled water, potassium metaperiodate in an amount sufficient to provide a 0.05 wt. percent of potassium metaperiodate. The periodate containing solution is heated to a temperature of about 130° to 140° F. To this solution is added about 0.004 wt. percent sodium meta-silicate based on the weight of the periodate solution utilized. The resultant reagent solution is typically about pH 8. The sodium meta-silicate is effective in adjusting the pH of this developing solution and eliminates the need for relatively harsh sulfuric acid or hydroxide reagents which heretofore had been used. Sodium meta-silicate is an excellent wetting and dispersing agent and also acts as a corrosion inhibitor for the manufacturing equipment with which the solution comes in contact. The sodium meta-silicate, since it is not as reactive or harsh a reagent, makes for ease of handling and in general it is lower in cost and requires a lesser amount of reagent to be added to the periodate containing developing solution. The sodium meta-silicate is also found to be less harsh on the opaque matrix material in that it does not degrade the opaque material which is to remain on the face plate.

What is claimed is:

1. An improved method for establishing a light absorbing pattern on a screen substrate of a color television picture tube in which photosensitized polyvinyl alcohol, which becomes less soluble upon exposure to radiation, is first deposited onto the screen substrate and thereafter, exposing the sensitized coating to radiation in a predetermined pattern, developing the exposed sensitized polyvinyl alcohol coating and removing the unexposed areas of said coatings, applying to the substrate a coating of an opaque material to cover the exposed sensitized polyvinyl alcohol and the exposed substrate surface, and chemically developing the opaquely coated exposed sensitized polyvinyl alcohol with a periodate compound containing aqueous developing solution to loosen and remove the coated exposed portions, while leaving the opaque coating on the screen substrate in the desired light absorbing pattern, the improvement wherein a predetermined amount of sodium meta-silicate is included in the developing solution.

2. The method specified in claim 1, wherein the sodium meta-silicate is included in an amount of from 0.001 to 1.0 weight percent of the periodate containing solution.

3. The method specified in claim 1, wherein the periodate compound is potassium meta-periodate present in an amount of 0.02 to 0.4 weight percent of the solution, and the sodium meta-silicate is included in an amount of 0.004 weight percent of the solution.

* * * * *